(12) United States Patent
Otto

(10) Patent No.: US 12,218,694 B2
(45) Date of Patent: Feb. 4, 2025

(54) BIT PATTERN SEQUENCE COMPRESSOR

(71) Applicant: Schweitzer Engineering Laboratories, Inc., Pullman, WA (US)

(72) Inventor: Jeff L. Otto, Moscow, ID (US)

(73) Assignee: Schweitzer Engineering Laboratories, inc., Pullman, WA (US)

( * ) Notice: Subject to any disclaimer, the term of this patent is extended or adjusted under 35 U.S.C. 154(b) by 189 days.

(21) Appl. No.: 18/295,915

(22) Filed: Apr. 5, 2023

(65) Prior Publication Data

US 2024/0340024 A1    Oct. 10, 2024

(51) Int. Cl.
| | |
|---|---|
| *H03M 7/30* | (2006.01) |
| *H01H 71/02* | (2006.01) |
| *H03K 17/16* | (2006.01) |

(52) U.S. Cl.
CPC .......... *H03M 7/30* (2013.01); *H01H 71/0207* (2013.01); *H03K 17/16* (2013.01)

(58) Field of Classification Search
CPC ...... H03M 7/30; H01H 71/0207; H03K 17/16
See application file for complete search history.

(56) References Cited

U.S. PATENT DOCUMENTS

| | | |
|---|---|---|
| 3,849,637 A | 11/1974 | Caruso |
| 4,387,336 A | 6/1983 | Joy |
| 4,829,298 A | 5/1989 | Fernandes |
| 4,916,328 A | 4/1990 | Culp |
| 5,006,846 A | 4/1991 | Granville |
| 5,224,011 A | 6/1993 | Yalla |
| 5,341,265 A | 8/1994 | Westrom |
| 5,436,510 A | 7/1995 | Gilbert |
| 5,446,682 A | 8/1995 | Janke |
| 5,498,956 A | 3/1996 | Kinney |
| 5,592,393 A | 1/1997 | Yalla |
| 5,694,281 A | 12/1997 | Roberts |
| 5,703,745 A | 12/1997 | Roberts |

(Continued)

FOREIGN PATENT DOCUMENTS

| | | |
|---|---|---|
| CN | 101545953 | 1/2011 |
| DE | 10200733 | 7/2003 |
| EP | 1381132 | 9/2010 |

OTHER PUBLICATIONS

Kai Sun, Da-Zhong Zheng and Qiang Lu, "Splitting Strategies for Islanding Operation of Large-Scale Power Systems Using OBDD-based methods," in IEEE Transactions on Power Systems, vol. 18, No. 2, pp. 912-923, May 2003.

(Continued)

*Primary Examiner* — Joseph J Lauture
(74) *Attorney, Agent, or Firm* — Fletcher Yoder, P.C.

(57) ABSTRACT

An electric power system may include numerous devices electrically connected to numerous other devices. In some cases, it may be beneficial to quickly determine and resolve an electric power system topology. The present disclosure is directed to systems and methods for resolving an electric power system topology using bit pattern sequence compression. A multi-node device may be electrically coupled to one node per side. Each node may be associated with a bit value. The bit values may be compared to determine if the nodes are electrically coupled. This process may be recursively performed for all of the multi-node devices, until it is determined which devices are electrically coupled and which are electrically isolated.

20 Claims, 7 Drawing Sheets

(56) References Cited

U.S. PATENT DOCUMENTS

| | | | |
|---|---|---|---|
| 5,731,943 | A | 3/1998 | Roberts |
| 5,734,586 | A | 3/1998 | Chiang |
| 5,963,404 | A | 10/1999 | Guzman |
| 6,028,754 | A | 2/2000 | Guzman |
| 6,204,642 | B1 | 3/2001 | Lawson |
| 6,236,949 | B1 | 5/2001 | Hart |
| 6,265,881 | B1 | 7/2001 | Meliopoulos |
| 6,341,055 | B1 | 1/2002 | Guzman |
| 6,356,421 | B1 | 3/2002 | Guzman |
| 6,411,865 | B1 | 6/2002 | Qin |
| 6,442,010 | B1 | 8/2002 | Kasztenny |
| 6,446,682 | B1 | 9/2002 | Viken |
| 6,492,801 | B1 | 12/2002 | Sims |
| 6,603,298 | B2 | 8/2003 | Guzman |
| 6,608,635 | B1 | 8/2003 | Mumm |
| 6,608,742 | B2 | 8/2003 | Schweitzer |
| 6,662,124 | B2 | 12/2003 | Schweitzer |
| 6,757,146 | B2 | 6/2004 | Benmouyal |
| 6,839,210 | B2 | 1/2005 | Roberts |
| 6,845,333 | B2 | 1/2005 | Anderson |
| 6,946,753 | B2 | 9/2005 | Kernahan |
| 7,138,728 | B2 | 11/2006 | LeRow |
| 7,196,884 | B2 | 3/2007 | Guzman |
| 7,319,576 | B2 | 1/2008 | Thompson |
| 7,480,580 | B2 | 1/2009 | Zweigle |
| 7,570,469 | B2 | 8/2009 | Guzman |
| 7,582,986 | B2 | 9/2009 | Folkers |
| 7,630,863 | B2 | 12/2009 | Zweigle |
| 7,660,088 | B2 | 2/2010 | Benmouyal |
| 7,698,233 | B1 | 4/2010 | Edwards |
| 7,710,693 | B2 | 5/2010 | Guzman |
| 7,856,327 | B2 | 12/2010 | Schweitzer, III |
| 8,112,235 | B2 | 2/2012 | Schweitzer, III |
| 8,131,383 | B2 | 3/2012 | Pearson |
| 8,604,803 | B2 | 12/2013 | Dooley |
| 8,606,372 | B1 | 12/2013 | Harris |
| 9,519,301 | B2 | 12/2016 | Bartlett |
| 9,954,372 | B2 | 4/2018 | Bartlett |
| 2003/0042876 | A1 | 3/2003 | Sadafumi |
| 2004/0027748 | A1 | 2/2004 | Kojovic |
| 2004/0059469 | A1 | 3/2004 | Hart |
| 2004/0164717 | A1 | 8/2004 | Thompson |
| 2006/0224336 | A1 | 10/2006 | Petras |
| 2007/0008968 | A1 | 1/2007 | Baker |
| 2007/0086134 | A1 | 4/2007 | Zweigle |
| 2007/0168088 | A1 | 7/2007 | Ewing |
| 2007/0219755 | A1 | 9/2007 | Williams |
| 2008/0074810 | A1 | 3/2008 | Guzman-Casillas |
| 2008/0281540 | A1 | 11/2008 | Zweigle |
| 2009/0085407 | A1 | 4/2009 | Venkatasubramanian |
| 2009/0088989 | A1 | 4/2009 | Guzman |
| 2009/0088990 | A1 | 4/2009 | Schweitzer |
| 2009/0089608 | A1 | 4/2009 | Guzman |
| 2009/0091867 | A1 | 4/2009 | Guzman |
| 2009/0099798 | A1 | 4/2009 | Gong |
| 2009/0125158 | A1 | 5/2009 | Schweitzer |
| 2010/0002348 | A1 | 1/2010 | Donolo |
| 2010/0114390 | A1 | 5/2010 | Stevenson |
| 2010/0312414 | A1 | 12/2010 | Kumar |
| 2011/0012422 | A1 | 1/2011 | Neher |
| 2011/0022245 | A1 | 1/2011 | Goodrum |
| 2011/0320058 | A1 | 12/2011 | Rietmann |
| 2012/0123602 | A1 | 5/2012 | Sun |
| 2012/0232710 | A1 | 9/2012 | Warner |
| 2012/0310559 | A1 | 12/2012 | Taft |
| 2013/0035885 | A1 | 2/2013 | Sharon |
| 2013/0116843 | A1 | 5/2013 | Kim |
| 2015/0015320 | A1* | 1/2015 | Han ............... H03K 19/00346 327/384 |
| 2015/0295529 | A1 | 10/2015 | Rose |

OTHER PUBLICATIONS

Mark Grant "Foxboro SCADA Systems Load Shedding and Electrical Monitoring Control Systems Design in Industrial Process Plants", 2012, retrieved on May 5, 2016 from http://iom.invensys.com/EN/pdfLibrary/WhitePaper_LoadSheddingandElectricalMonitoring.pdf.

M. Shafiullah, H. Rahman and M. Q. Ahsan, "Study of Impacts on Operation of Island and Frequency Based Auto Load Shedding to Improve Service Reliability Using CYME PSAF," 2012 7th International Conference on Electrical and Computer Engineering, Dhaka, 2012, pp. 583-586 (Year:2012).

Terry L. Conrad, Concurrent Technologies Corporation, Distributed State Estimator at U.S. Virgin Islands Water and Power Authority St. Thomas and St. John, NASPI Working Group Meeting, Mar. 7, 2008.

A.P. Sakis Meliopoulos, George J. Cokkinides, Floyd Galvan, Bruce Fardanesh, Georgia Institute of Technology, Entergy Services, Inc and New York Power Authority, Distributed State Estimator—Advances and Demonstration, 2008.

Ali Abur and Mladen Kezunovic, Texas A&M University, Sakis Meliopoulos, Georgia Institute of Technology, Enhanced State Estimation by Advanced Substation Monitoring, Power Systems Engineering Research Center, PSERC, Nov. 2002.

Saman A. Zonouz and William H. Sanders, Information Trust Institute, Coordinated Science Laboratory, and Electrical and Computer Engineering Department University of Illinois at Urbana-Champaign, A Kalman-based Coordination for Hierarchical State Estimation: Algorithm and Analysis, 2008.

Abb: Improved Power System Performance through Wide Area Monitoring, Protection, and Control, 2004.

Abb, Wide Area Measurement, Monitoring, Protection and Control Industrial IT for Energy System Operation- (2003).

Sasa Jakovljevic, Mladen Kezunovic, Software for Enhanced Monitoring in Integrated Substations, 2003 IEEE Bologna Power Tech Conference, Jun. 23-26, 2003.

Y. Wu, M. Kezunovic, Automatic Simulation of IED Measurements for Substation Data Integration Studies, Power Engineering Society General Meeting, Jun. 12-16, 2005.

Sasa Jakovljevic, Data Collecting and Processing for Substation Integration Enhancement, May 2003.

M. Kezunovic, G. Latisko, Automated Monitoring Functions for Improved Power System Operation and Control, Power Engineering Society General Meeting, Jun. 2005.

* cited by examiner

| ASSET ID | N4 | N3 | N2 | N1 | BIT PATTERN |
|---|---|---|---|---|---|
| BREAKER A | 0 | 0 | 1 | 1 | 3 |
| BREAKER B | 0 | 1 | 1 | 0 | 6 |
| BREAKER C | 1 | 1 | 0 | 0 | 12 |

BIT PATTERN SEQUENCE COMPRESSOR

BACKGROUND

This disclosure relates to electric power delivery systems. More particularly, this disclosure relates to control systems of an electric power delivery system.

Electric power delivery and/or distribution systems deliver electric power to residential and commercial consumers. The electric power delivery and/or distribution systems may include numerous devices, such as potential transformers, current transformers, and so on that are electrically connected to numerous other devices to deliver electric power. The topology of the power delivery and/or distribution system may define which of the devices are electrically coupled to which other devices. However, the power delivery and/or distribution systems may have numerous devices, thus making it difficult to quickly and accurately resolve the system topology and determine which devices are electrically coupled in an electrical fault scenario.

DETAILED DESCRIPTION

Figure 1:
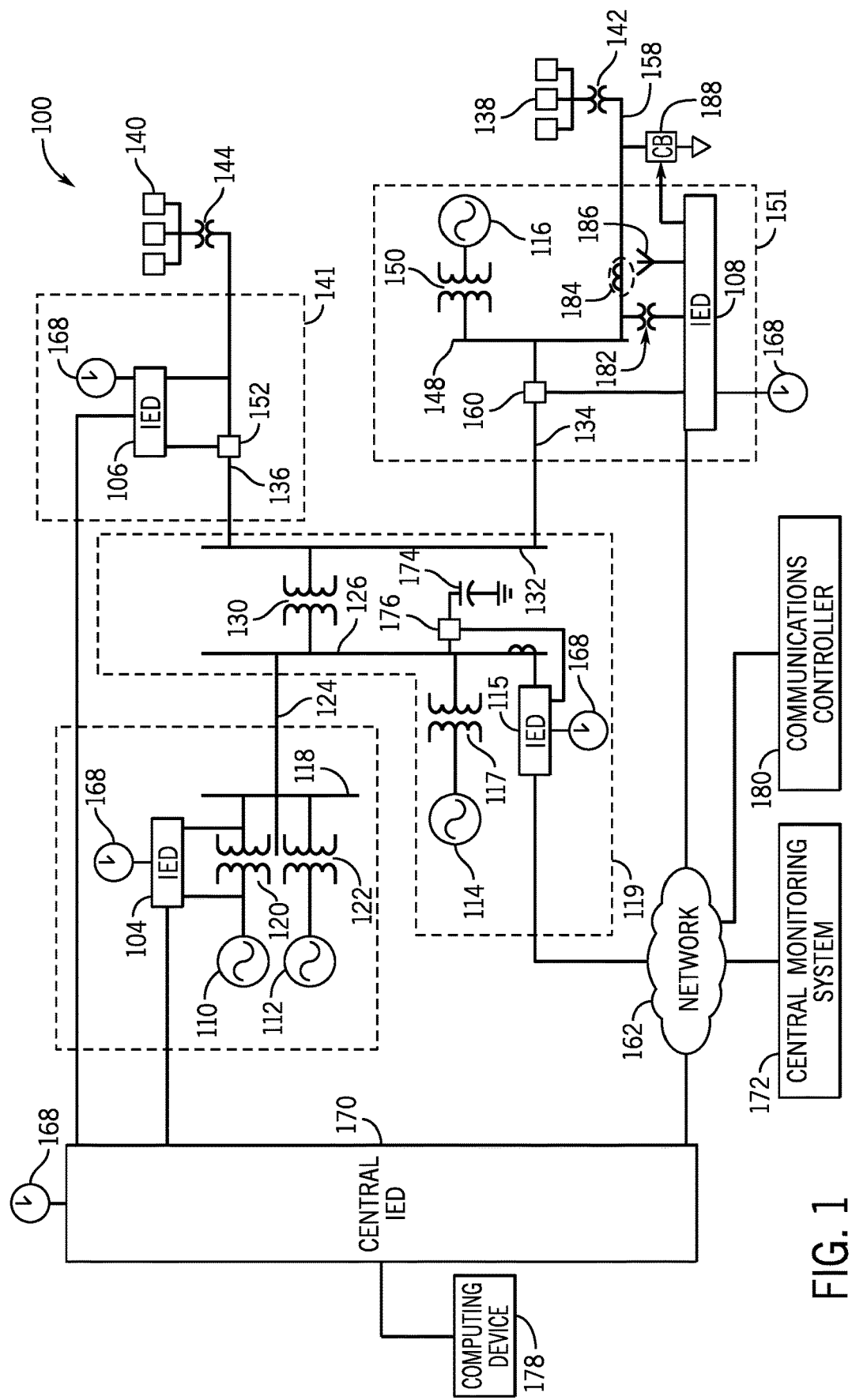
FIG. 1 is a schematic diagram of an embodiment of an electric power delivery system, in accordance with an aspect of the present disclosure.

When introducing elements of various embodiments of the present disclosure, the articles "a," "an," and "the" are intended to mean that there are one or more of the elements. The terms "comprising," "including," and "having" are intended to be inclusive and mean that there may be additional elements other than the listed elements. Additionally, it should be noted that references to "one embodiment" or "an embodiment" of the present disclosure are not intended to be interpreted as excluding the existence of additional embodiments that also incorporate the recited features. Furthermore, the phrase A "based on" B is intended to mean that A is at least partially based on B. Moreover, unless expressly stated otherwise, the term "or" is intended to be inclusive (e.g., logical OR) and not exclusive (e.g., logical XOR). In other words, the phrase "A or B" is intended to mean A, B, or both A and B.

Several aspects of the embodiments described may be implemented as software modules or components. As used herein, a software module or component may include any type of computer instruction or computer-executable code located within a memory device and/or transmitted as electronic signals over a system bus or wired or wireless network. A software module or component may, for instance, include physical or logical blocks of computer instructions, which may be organized as a routine, program, object, component, data structure, or the like, and which performs a task or implements a particular abstract data type.

An electric power system (e.g., a power delivery and/or distribution system) may include numerous devices (e.g., potential transformers, current transformers, and so on) electrically connected to numerous other devices. In some cases, it may be beneficial to quickly determine and resolve an electric power system topology. In an embodiment, controller development software may determine the power system topology based on a received bit pattern. For example, if a substation topology is being analyzed, the controller development software may receive one bit pattern per each circuit breaker (or any other appropriate multi-node device, such as a disconnect switch) in the topology for a given phase. For the circuit breakers, the bit pattern may include the result of two asserted bits, which may correspond to a topology node index (e.g., N1, N2, N3, N4, and so on) on either side of the breaker. The bit patterns may be recursively accumulated via pattern buffers by determining a logical intersection between two consecutive patterns. If a logical intersection is determined, the two patterns may be compressed (e.g., via a logical OR operation) into a union of the two patterns. The compressed patterns may be outputted to the controller development software to indicate that the devices (e.g., the transformers) are electrically coupled.

If no logical intersection is determined, the two patterns may bypass compression (e.g., bypass a bit compressor) and each be independently stored into one of the buffers. The independent (e.g., uncompressed) patterns may be outputted to the controller development software after the compression process is complete to indicate that one or more of the devices (e.g., the transformers) are electrically isolated from one or more of the other devices. For example, a first breaker switch may be electrically isolated from a second breaker switch if a third breaker switch disposed between the first and the second breaker switch is opened (e.g., due to an electrical fault). In the pattern buffers, for each new bit pattern inserted into the bit compressor, one buffer is emptied while another buffer is populated.

With the preceding in mind, FIG. 1 is a schematic diagram of an electric power delivery system 100 that may generate, transmit, and/or distribute electric energy to various loads (e.g., different structures). The electric power delivery system 100 may use various intelligent electronic devices (IEDs) 104, 106, 108, 115 to control certain aspects of the electric power delivery system 100. As used herein, an IED (e.g., the IEDs 104, 106, 108, 115) may refer to any processing-based device that monitors, controls, automates, and/or protects monitored equipment within the electric power delivery system 100. Although the present disclosure primarily discusses the IEDs 104, 106, 108, 115 as relays, such as a remote terminal unit, a differential relay, a distance relay, a directional relay, a feeder relay, an overcurrent relay, a voltage regulator control, a voltage relay, a breaker failure relay, a generator relay, and/or a motor relay, additional IEDs 104, 106, 108, 115 may include an automation controller, a bay controller, a meter, a recloser control, a communications processor, a computing platform, a programmable logic controller (PLC), a programmable automation controller, an input and output module, and the like. Moreover, the term IED may be used to describe an individual IED or a system including multiple IEDs.

For example, the electric power delivery system 100 may be monitored, controlled, automated, and/or protected using the IEDs 104, 106, 108, 115, and a central monitoring system 172 (e.g., an industrial control system). In general, the IEDs 104, 106, 108, 115 may be used for protection, control, automation, and/or monitoring of equipment in the electric power delivery system 100. For example, the IEDs 104, 106, 108, 115 may be used to monitor equipment of many types, including electric power lines, current sensors, busses, switches, circuit breakers, reclosers, transformers, autotransformers, tap changers, voltage regulators, capacitor banks, generators, motors, pumps, compressors, valves, and a variety of other suitable types of monitored equipment.

A common time signal may be distributed throughout the electric power delivery system 100. Utilizing a common time source may ensure that IEDs 104, 106, 108, 115 have a synchronized time signal that can be used to generate time synchronized data, such as synchrophasors. In various embodiments, the IEDs 104, 106, 108, 115 may receive a common time signal 168. The time signal may be distributed in the electric power delivery system 100 using a communications network 162 and/or using a common time source, such as a Global Navigation Satellite System ("GNSS"), or the like.

The IEDs 104, 106, 108, 115 may be used for controlling various other equipment of the electrical power delivery system 100. By way of example, the illustrated electric power delivery system 100 includes electric generators 110, 112, 114, 116 and power transformers 117, 120, 122, 130, 142, 144, 150. The electric power delivery system 100 may also include electric power lines 124, 134, 136, 158 and/or busses 118, 126, 132, 148 to transmit and/or deliver power, circuit breakers 152, 160, 176 to control flow of power in the electric power delivery system 100, and/or loads 138, 140 to receive the power in and/or from the electric power delivery system 100. A variety of other types of equipment may also be included in the electric power delivery system 100, such as a voltage regulator, a capacitor (e.g., a capacitor 174), a potential transformer (e.g., a potential transformer 182), a current sensor (e.g., a wireless current sensor (WCS) 184), an antenna (e.g., an antenna 186), a capacitor bank (e.g., a capacitor bank (CB) 188), and other suitable types of equipment useful in power generation, transmission, and/or distribution.

A substation 119 may include the electric generator 114, which may be a distributed generator and which may be connected to the bus 126 through the power transformer 117 (e.g., a step-up transformer). The bus 126 may be connected to the bus 132 (e.g., a distribution bus) via the power transformer 130 (e.g., a step-down transformer). Various electric power lines 136, 134 may be connected to the bus 132. The electric power line 136 may lead to a substation 141 in which the electric power line 136 is monitored and/or controlled using the IED 106, which may selectively open and close the circuit breaker 152. The load 140 may be fed from the electric power line 136, and the power transformer 144 (e.g., a step-down transformer) in communication with the bus 132 via electric power line 136 may be used to step down a voltage for consumption by the load 140.

The electric power line 134 may deliver electric power to the bus 148 of the substation 151. The bus 148 may also receive electric power from the distributed electric generator 116 via the power transformer 150. The electric power line 158 may deliver electric power from the bus 148 to the load 138 and may include the power transformer 142 (e.g., a step-down transformer). The circuit breaker 160 may be used to selectively connect the bus 148 to the electric power line 134. The IED 108 may be used to monitor and/or control the circuit breaker 160 as well as the electric power line 158.

According to various embodiments, the central monitoring system 172 may include one or more of a variety of types of systems. For example, the central monitoring system 172 may include a supervisory control and data acquisition (SCADA) system and/or a wide area control and situational awareness (WACSA) system. A central IED 170 (e.g., a switch) may be in communication with the IEDs 104, 106, 108, 115. The IEDs 104, 106, 108, 115 may be remote from the central IED 170 and may communicate over various media. For instance, the central IED 170 may be directly in communication with the IEDs 104, 106 and may be in communication with the IEDs 108, 115 via the communications network 162.

The central IED 170 may enable or block data flow between any of the IEDs 104, 106, 108, 115. For example, during operation of the electric power delivery system 100, the IEDs 104, 106, 108, 115 may transmit data with one another to perform various functionalities for the electric power delivery system 100 by initially transmitting the data to the central IED 170. The central IED 170 may receive the data and may subsequently transmit the data to an intended recipient of the data. The central IED 170 may also control data flow between one of the IEDs 104, 106, 108, 115 and another device communicatively coupled to the central IED 170, such as a computing device 178. For instance, the computing device 178 may be a laptop, a mobile phone, a desktop, a tablet, or another suitable device with which a user (e.g., a technician, an operator) may interact. As such, the user may utilize the computing device 178 to receive data, such as operating data, from the electric power delivery system 100 via the central IED 170 and/or to send data, such as a user input, to the electric power delivery system 100 via the central IED 170. Thus, the central IED 170 may enable or block operation of the electric power delivery system 100 via the computing device 178.

A communications controller 180 may interface with equipment in the communications network 162 to create a software-defined network that facilitates communication between the central IED 170, the IEDs 104, 106, 108, 115, and/or the central monitoring system 172. In various embodiments, the communications controller 180 may interface with a control plane (not shown) in the communications network 162. Using the control plane, the communications controller 180 may direct the flow of data within the communications network 162. Indeed, the communications controller 180 may communicate with the central IED 170 to instruct the central IED 170 to transmit certain data (e.g., data associated with a certain set of characteristics or information) to a particular destination (e.g., an intended recipient) using flows, matches, and actions defined by the communications controller 180.

Figure 2:
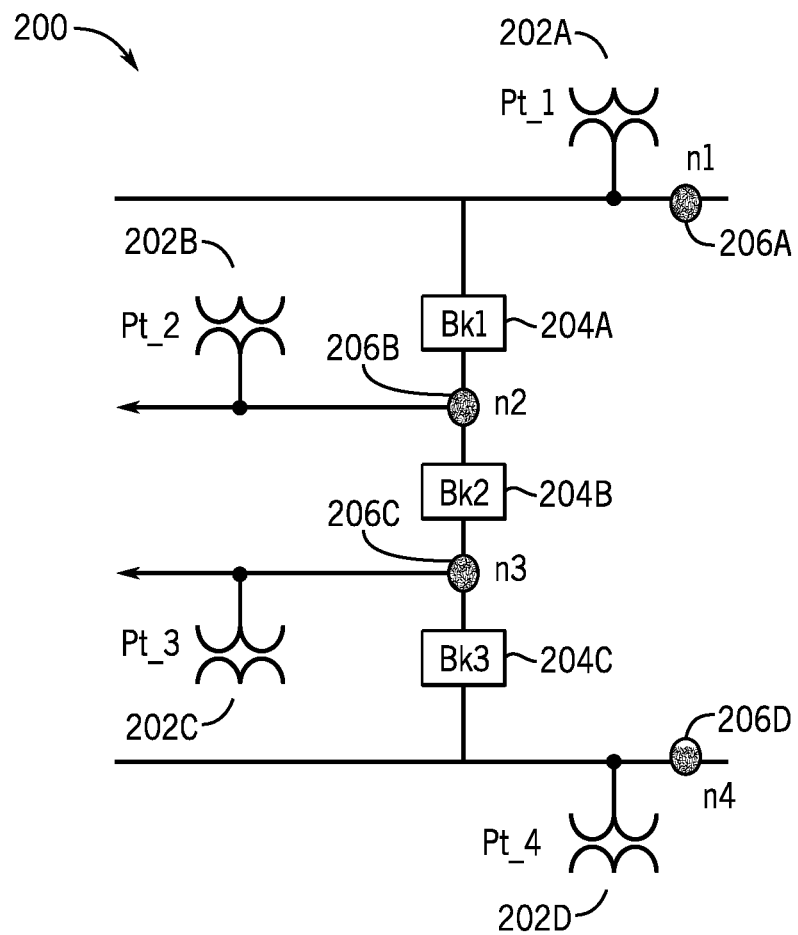
FIG. 2 is a diagram representing an electric power system that includes a portion of the electric power delivery system of FIG. 1, in accordance with an aspect of the present disclosure.

FIG. 2 is a diagram representing an electric power system 200 (e.g., a portion of the electric power delivery system 100), according to an embodiment of the present disclosure. It should be noted that the electric power system 200 is provided as an example use case of the bit pattern sequence generator, and the bit pattern sequence generator may be implemented for any appropriate electric power system including any suitable number of components (e.g., any suitable number of transformers, circuit breakers, IEDs, and so on). It should also be noted that the topology that is defined by the bit pattern sequence may have any suitable size, number of devices, type of devices, and so on.

The electric power system 200 includes a transformer 202A, a transformer 202B, a transformer 202C, and a transformer 202D. The transformer 202A and the transformer 202B may be electrically coupled via a circuit breaker 204A, the transformer 202B and the transformer 202C may be electrically coupled via a circuit breaker 204B, and the transformer 202C and the transformer 202D may be electrically coupled via a circuit breaker 204C. The IEDs 104, 106, 108, 115 may include the circuit breakers 204A, 204B, and 204C (collectively, the circuit breakers 204).

Each circuit breaker 204 may be coupled to two nodes. The circuit breaker 204A coupled between a node 206A and a node 206B; the circuit breaker 204B is coupled between the node 206B and a node 206C; and the circuit breaker 204C is coupled between the node 206C and a node 206D.

A control system (e.g., a control system running controller development software) may analyze the electric power system 200 and may determine the topology of the electric power system 200. As will be discussed in greater detail below, the control system may determine the topology of the electric power system based on bit values asserted at each of the nodes 206A, 206B, 206C, and 206D (collectively, the nodes 206). The bit values asserted at each of the nodes 206 may enable the control system to quickly and accurately determine the topology of the power system 200 by compressing the relationship between devices (e.g., the circuit breakers 204) into a single bit pattern. It should be appreciated that, by compressing the relationship between the devices into a single bit pattern, the data used to store information regarding the topology of the electric power system 200 may be reduced. While the compression will be discussed as compressing to a single bit pattern, it should be noted that in some embodiments the relationship between the devices may be compressed into a single bit value.

While the electric power system 200 is shown to include four transformers, three breakers, and four nodes, it should be noted that the electric power system 200 may include any number of transformers (e.g., five or more, 10 or more, 50 or more, 100 or more), any number of circuit breakers (e.g., five or more, 10 or more, 50 or more, 100 or more), and any number of nodes (e.g., five or more, 10 or more, 50 or more, 100 or more). It should also be noted that a circuit breaker 204 may be associated with any number of nodes, such as one node, or three or more nodes.

Figure 3:
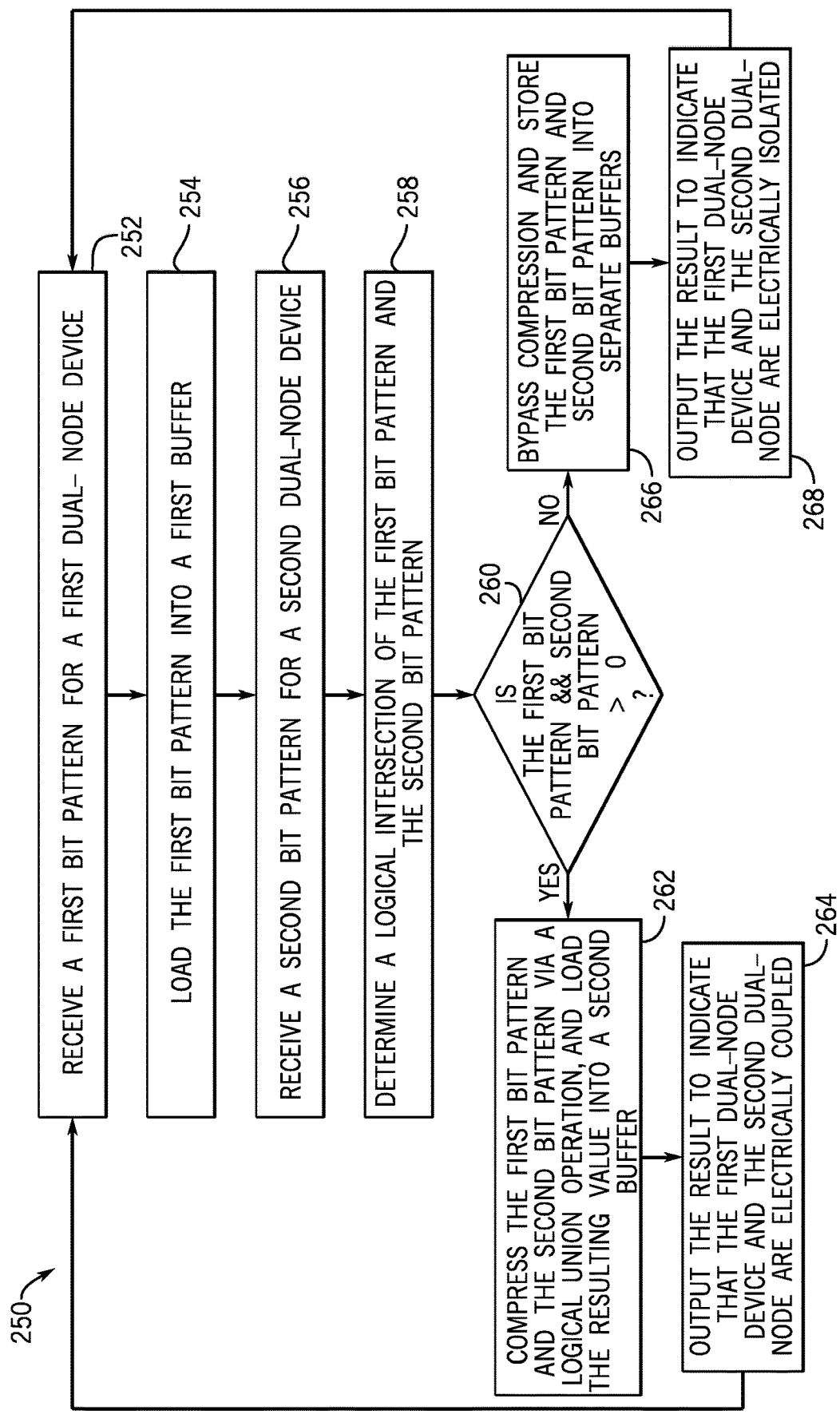
FIG. 3 is a flowchart of a method for resolving the topology of the electric power system of FIG. 2 using bit pattern sequence compression, in accordance with an aspect of the present disclosure.

FIG. 3 is a flowchart of a method 250 for resolving an electric power system topology using bit pattern sequence compression, according to an embodiment of the present disclosure. Any suitable device (e.g., a controller) that may control components of the electric power delivery system 100, such as the processor 12 (e.g., of the IEDs 104, 106, 108, 115), may perform the method 250. In some embodiments, the method 250 may be implemented by executing instructions stored in a tangible, non-transitory, computer-readable medium, such as the memory 14, using the processor 12. For example, the method 250 may be performed at least in part by one or more software components, such as the control development software, one or more software applications of the IEDs 104, 106, 108, 115, and the like. While the method 250 is described using steps in a specific sequence, it should be understood that the present disclosure contemplates that the described steps may be performed in different sequences than the sequence illustrated, and certain described steps may be skipped or not performed altogether.

In process block 252, the processor receives a first bit pattern for a first device (e.g., a multi-node device such as the circuit breaker 204A). The first bit pattern may include a bit pattern of a given size (e.g., 8-bit, 16-bit, 32-bit, 64-bit, 128-bit, 256-bit) for a given phase. The bit pattern may include any number of asserted bits, which correspond to a topology node index. For instance, using the circuit breaker 204A as an example, the asserted bits may represent the nodes on either side of the circuit breaker 204A (e.g., at the node 206A and the node 206B). If a device is connected to more than two nodes, more than two bits may be asserted that correspond to all of the nodes that are connected by that device. In process block 254, the processor may load the first bit pattern into a first buffer. In process block 256, the processor receives a second bit pattern for a second device (e.g., a second multi-node device such as the circuit breaker 204B). Similar to the first bit pattern, the second bit pattern may include a bit pattern of a given size (e.g., 8-bit, 16-bit, 32-bit, 64-bit, 128-bit, 256-bit; the same size as the first bit pattern) for a given phase. Using the circuit breaker 204B as an example, the second bit pattern may include two bits asserted, which may correspond to a topology node index on either side of the circuit breaker 204B (e.g., at the node 206B and the node 206C). As previously mentioned, while the second bit pattern is discussed as including two bits asserted, the bit patterns may include any appropriate number of asserted bits (e.g., 1 bit, 2 bits, 4 bits, 8 bits, 16 bits, 32 bits, and so on).

In process block 258, the processor determines a logical intersection (e.g., a logical AND bitwise operation) of the first bit pattern and the second bit pattern. If, in query block 260, the processor determines that the logical intersection of the first bit pattern and the second bit pattern produces a value that is greater than 0 (e.g., the resulting value of the bitwise operation is non-zero), in process block 262, the processor compresses a first value corresponding to the first bit pattern and a second value corresponding to the second bit pattern via a logical union operation (e.g., a logical OR bitwise operation) and loads the resulting value into a second buffer. After compressing the first bit pattern and the second bit pattern, the processor, in process block 264, outputs the result (e.g., to the controller or to the control development software). For example, the result may indicate that the first multi-node device (e.g., the circuit breaker 204A) and the second multi-node device (e.g., the circuit breaker 204B) are electrically coupled. By using a single compressed bit pattern to indicate the relationship of one or more electrical devices in an electric power delivery system, the method 250 may enable fast and accurate resolution of an electric power delivery system topology while reducing the size of the data used to represent the electric power delivery system topology.

However, if, in the query block 260, the processor determines that the logical intersection of the first bit pattern and the second bit pattern produces a value of 0, in process block 266, compression may be bypassed and the first value corresponding to the first bit pattern and the second value corresponding to the second bit pattern may be stored in separate buffers. In process block 268, the processor may output the separate (e.g., uncompressed) values to the controller or to the control development software. For example, this may indicate that the first multi-node device (e.g., the circuit breaker 204A) and the second multi-node device (e.g., the circuit breaker 204B) are electrically isolated. In this manner, the method 250 may enable fast and accurate resolution of an electric power delivery system topology while reducing the size of the data used to represent the electric power delivery system topology. For example, a control system of the electric power system 200 may quickly and accurately determine whether any two devices are electrically coupled or electrically isolated by determining whether one compressed bit pattern or two uncompressed bit patterns are associated with a common node between the devices. The method 250 may be recursively performed for any subsequent pairs of multi-node devices in an electric power system. For example, the method 250 may repeat to determine that the circuit breaker 204C is electrically coupled to the circuit breaker 204B.

Figure 4:
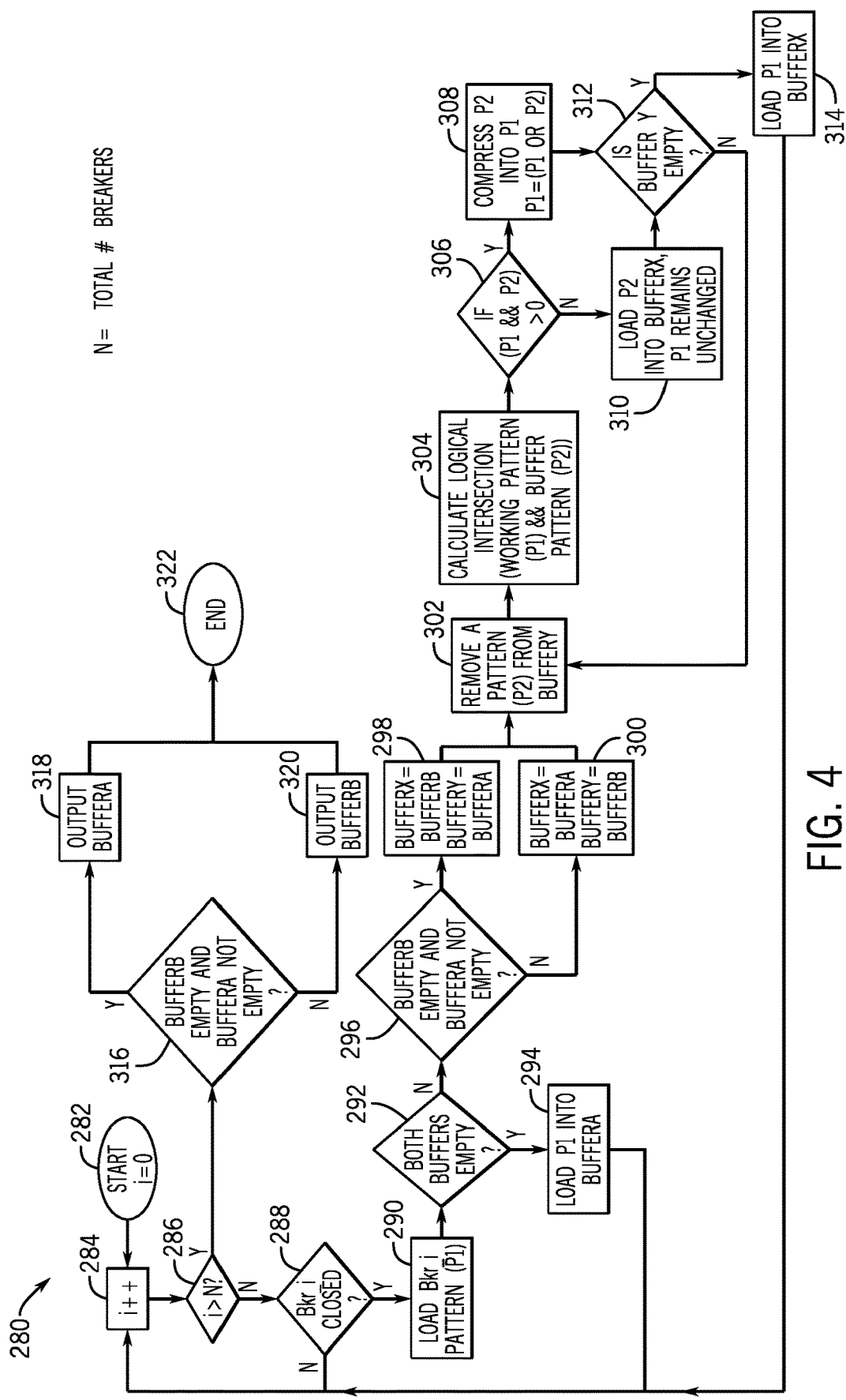
FIG. 4 is a flowchart of a detailed method for performing the method of FIG. 3, in accordance with an aspect of the present disclosure.

FIG. 4 is a flowchart of a method 280 for resolving an electric power system topology using bit pattern sequence compression, according to an embodiment of the present disclosure. The method 280 is a detailed embodiment of the method 280. Any suitable device (e.g., a controller) that may control components of the electric power delivery system 100, such as the processor 12 (e.g., of the IEDs 104, 106, 108, 115), may perform the method 280. In some embodiments, the method 280 may be implemented by executing instructions stored in a tangible, non-transitory, computer-readable medium, such as the memory 14, using the processor 12. For example, the method 280 may be performed at least in part by one or more software components, such as the control development software, one or more software applications of the IEDs 104, 106, 108, 115, and the like. While the method 280 is described using steps in a specific sequence, it should be understood that the present disclosure contemplates that the described steps may be performed in different sequences than the sequence illustrated, and certain described steps may be skipped or not performed altogether.

In process block 282, the processor determines a first device (e.g., the circuit breaker 204A). In process block 284, the processor increments the first device to a second device (e.g., the circuit breaker 204B) if the compression process has finished for the first circuit breaker 204A. In query block 286, the processor determines if the circuit breaker i (e.g., the circuit breaker 204A) is the last circuit breaker in a system (e.g., if a certain number of circuit breaker exceeds a total number of circuit breakers). If, in the query block 286, it is determined that the circuit breaker 204A is not the last circuit breaker 204 in the system 200, in query block 288, the processor determines if the circuit breaker 204A is closed. If the circuit breaker 204A is not closed, the processor returns to the process block 284 and increments to the next circuit breaker 204 in the system 200 (e.g., the circuit breaker 204B).

If, in query block 288 the processor determines that the circuit breaker 204A is closed, in process block 290, the processor loads the bit pattern associated with the circuit breaker 204A. In query block 292, the processor determines if both of two pattern buffers are empty. If the processor determines that both buffers are empty, the processor loads, in process block 294, the bit pattern associated with the circuit breaker 204A into a first pattern buffer, buffer A. The processor then returns to the process block 284, increments to the next circuit breaker 204, and continues with the method 280. If, in the query block 292, the processor determines that both of the pattern buffers are not empty, in query block 296, the processor determines if the buffer A is full and a second pattern buffer, buffer B is empty. If the processor determines that buffer A is full and buffer B is empty, the processor, in process block 298, assigns buffer B as buffer X and assigns buffer A as buffer Y. If, in the query block 296, the processor determines that buffer B is full and buffer A is empty, the processor, in process block 300, assigns buffer A as buffer X and assigns buffer B as buffer Y.

In process block 302, the processor removes a bit pattern from buffer Y. In process block 304, the processor calculates a logical intersection between a first bit pattern (originates from block 290) and a second bit pattern (originates from block 302). In query block 306, the processor determines if the logical intersection of the first bit pattern and the second bit pattern is greater than 0. If the processor determines that the logical intersection between the first bit pattern and the second bit pattern is greater than 0, in process block 308, the processor compresses the second bit pattern into the first bit pattern via a logical union operation. This operation modifies the first bit pattern. If the processor determines that the logical intersection of the first bit pattern and the second bit pattern is not greater than zero (e.g., is equal to zero), in process block 310 the processor loads the second bit pattern into buffer X and the first bit pattern remains unchanged. In query block 312, the processor determines if buffer Y is empty. If buffer Y is not empty, the processor returns to the process block 302. If the buffer Y is empty, the processor loads the first bit pattern into buffer X in process block 314.

Returning to the query block 286, if the processor determines that the last circuit breaker 204 has been surpassed (e.g., a circuit breaker i exceeds the total number of circuit breakers N), in query block 316, the processor determines if buffer B is empty and buffer A is filled. If buffer B is empty and buffer A is filled, in process block 318 the processor outputs buffer A. If Buffer B is not empty and buffer A is not filled, in process block 320, the processor outputs buffer B.

Figure 5:
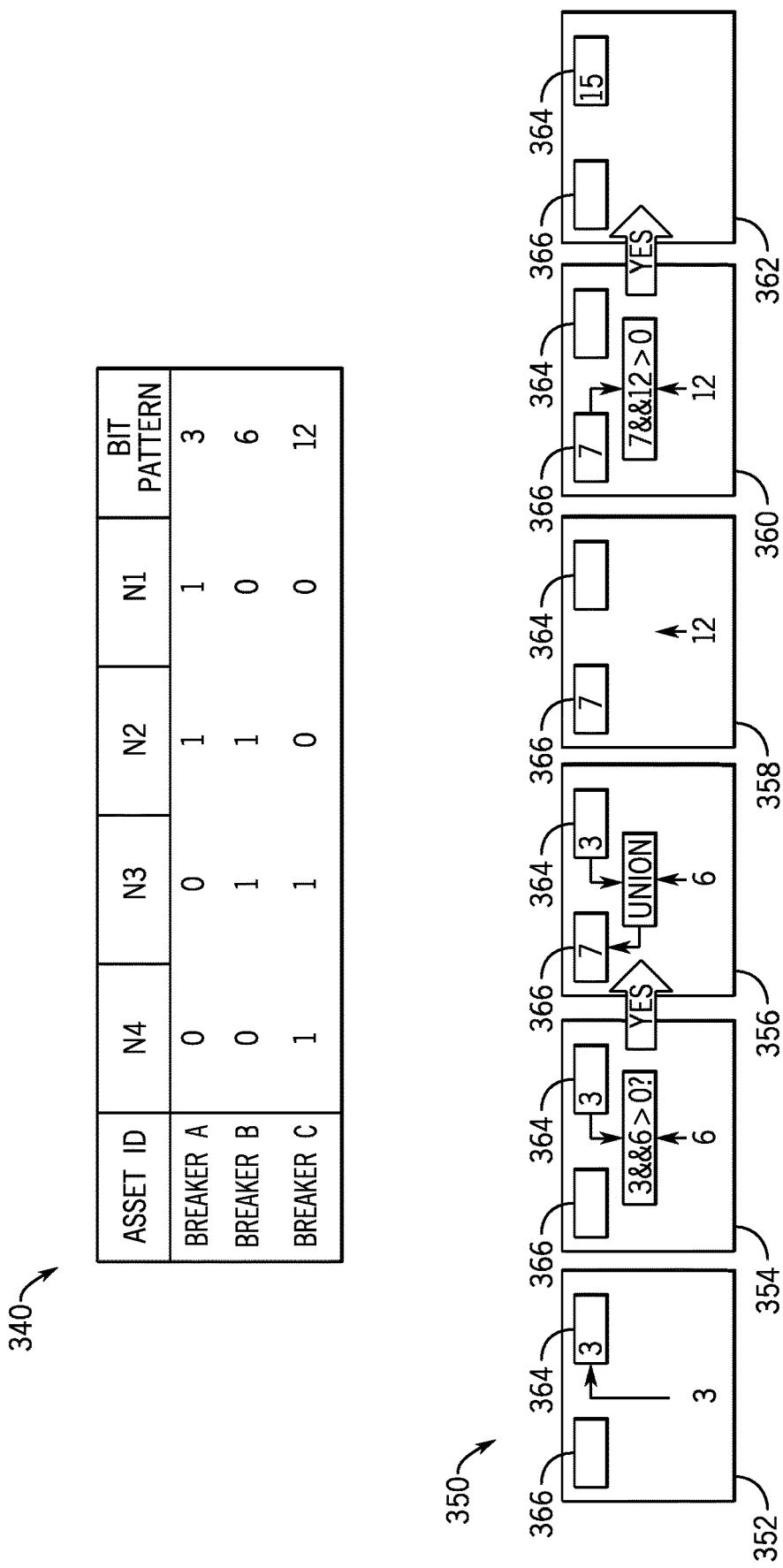
FIG. 5 is a diagram illustrating resolving the topology of the electric power system of FIG. 2 using bit pattern sequence compression as described in the flowchart discussed with respect to FIG. 3, in accordance with an aspect of the present disclosure.

FIG. 5 is a diagram illustrating resolving an electric power system topology using bit pattern sequence compression as described in the method 250 discussed with respect to FIG. 3, according to an embodiment of the present disclosure. FIG. 5 includes the table 340 and a flow diagram 350 showing the stages of bit pattern sequence analysis.

To provide bit sequence compression, each node 206 may be assigned a bit value. For example, node 206A may be assigned a bit value of 1 (e.g., may be assigned a binary value of 0001), node 206B may be assigned a bit value of 2 (e.g., a binary value of 0010), node 206C may be assigned a bit value of 4 (e.g., a binary value of 0100), and node 206D may be assigned a bit value of 8 (e.g., a binary value of 1000). As may be observed from the table 340, each circuit breaker 204 may be electrically coupled to a node on each side, when the bit corresponding to the node is asserted, each circuit breaker electrically coupled to the node may reflect the bit pattern associated with the node.

For example, as the circuit breaker 204A is electrically coupled to the node 206A and node 206B which have bit values of 1 (e.g., a binary value of 0001) and 2 (e.g., a binary value of 0010), respectively, when the bits are asserted they may be combined by a bitwise OR operation, and produce a bit pattern value of 3 (e.g., 0011) associated with the circuit breaker 204A. Similarly, the circuit breaker 204B is electrically coupled to the nodes 206B and 206C and the circuit breaker 204C is electrically coupled to the nodes 206C and 206D. Consequently, the circuit breaker 204B may be associated with a bit pattern of 6 or 0110 (e.g., resulting from the bitwise OR operation of the bit values 2 and 4, or 0010 and 0100 in binary) and the circuit breaker 204C may be associated with a bit pattern of 12 or 1100 (e.g., resulting from the bitwise OR operation of the bit values 4 and 8, or 0100 and 1000 in binary).

It should be understood that the circuit breaker 204 may determine a bit value equal to 0 associated with a particular node 206 if the circuit breaker 204 is open (e.g., as a result of a fault on the electric power system 200), and the circuit breaker 204 may determine a non-zero bit value associated with the particular node 206 if the breaker is closed (e.g., during normal operation of the electric power system 200). As may be observed from the logical flow diagram 350, in action 352 the bit pattern 3 associated with the circuit breaker 204A is loaded into a pattern buffer 364. In action 354, the processor may receive the bit pattern 6 associated with the circuit breaker 204B. The processor may perform a bitwise AND operation to determine if there is any overlapping HIGH bit values between the circuit breaker 204A and the circuit breaker 204B. As may be observed from the table 340, the circuit breaker 204A and the circuit breaker 204B overlap at the node 206B (e.g., indicating that the node 206B is asserting a non-zero bit value at both the circuit breaker 204A and the circuit breaker 204B).

Upon determining that the bitwise AND operation produces a non-zero bit value, the processor may, in action 356, compress the values associated with the circuit breaker 204A and 204B by performing a bitwise OR operation on the circuit breaker 204A and the circuit breaker 204B. Looking to the table 340, it may be appreciated that performing the bitwise OR operation on the values of node 206A, node 206B, and node 206C (e.g., the nodes electrically coupled to the circuit breaker 204A and the circuit breaker 204B) produces a compressed bit pattern of 7, or 0111 in binary. The processor then loads the bit pattern of 7 (e.g., 0111) into a pattern buffer 366. Such compression may enable control system to determine that the circuit breaker 204A and the circuit breaker 204B are electrically coupled by determining the single compressed bit pattern of 7 (e.g., 0111) in the pattern buffer 366.

In action 358, the processor receives the bit pattern associated with the circuit breaker 204C (e.g., bit pattern of 12, or 1100). In action 360, the processor may perform a bitwise AND operation to determine if there is any overlapping HIGH bit values between the circuit breaker 204B and the circuit breaker 204C. As may be observed from the table 340, the breaker 204B and the circuit breaker 204C overlap at the node 206C (e.g., indicating that the node 206C is asserting a non-zero bit value at both the circuit breaker 204B and the circuit breaker 204C).

Upon determining that the bitwise AND operation produces a non-zero bit value, the processor may, in action 362, perform a bitwise OR operation on the node bit values associated with the circuit breakers 204A and 204B and the node bit values associated with the circuit breaker 204C. Looking to the table 340, it may be appreciated that performing the bitwise OR operation on the value of 7 or 0111 (e.g., representing the compression of the values assigned to the node 206A, the node 206B, and the node 206C) and the value assigned to the node 206D, 12 or 1100, produces a bit pattern of 15, or 1111. The processor then loads the bit pattern of 15 (e.g., 1111) into the pattern buffer 364. The processor may output the value of 15 or 1111 (e.g., to the controller or the control development software of the electric power system 200) to indicate to the controller or the control development software that the circuit breakers 204, and thus the transformers 202, are electrically coupled. As may be appreciated, the controller or the control development software of the electric power system 200 may quickly and accurately resolve the topology of the electric power system 200 by analyzing the compressed bit pattern of 15 (e.g., 1111).

Figure 6:
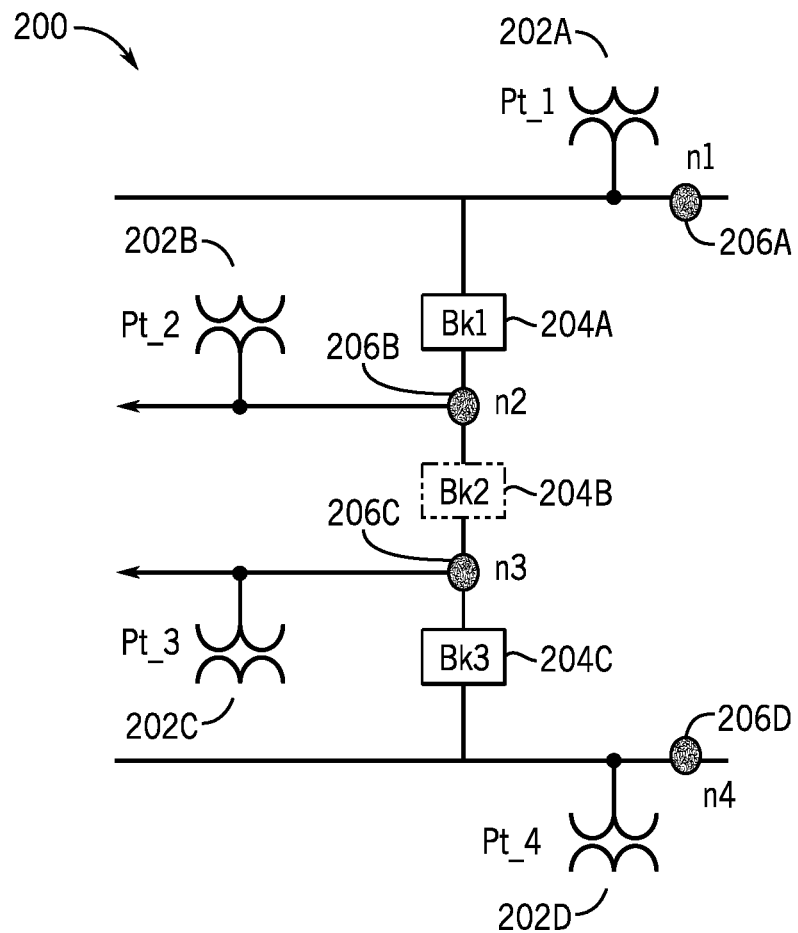
FIG. 6 is a diagram representing the electric power system of FIG. 2 including an electrically isolated circuit breaker, in accordance with an aspect of the present disclosure.

FIG. 6 is a diagram representing the electric power system 200 with an electrically isolated circuit breaker, according to an embodiment of the present disclosure. As may be observed from the electric power system 200, the breaker 204A and the circuit breaker 204C are closed, and the breaker 204B is open. As discussed with respect to FIG. 5, each node 206A, 206B, 206C, and 206D may be assigned a bit value of 1 (e.g., 0001), 2 (e.g., 0010), 4 (e.g., 0100), and 8 (e.g., 1000), respectively.

Figure 7:
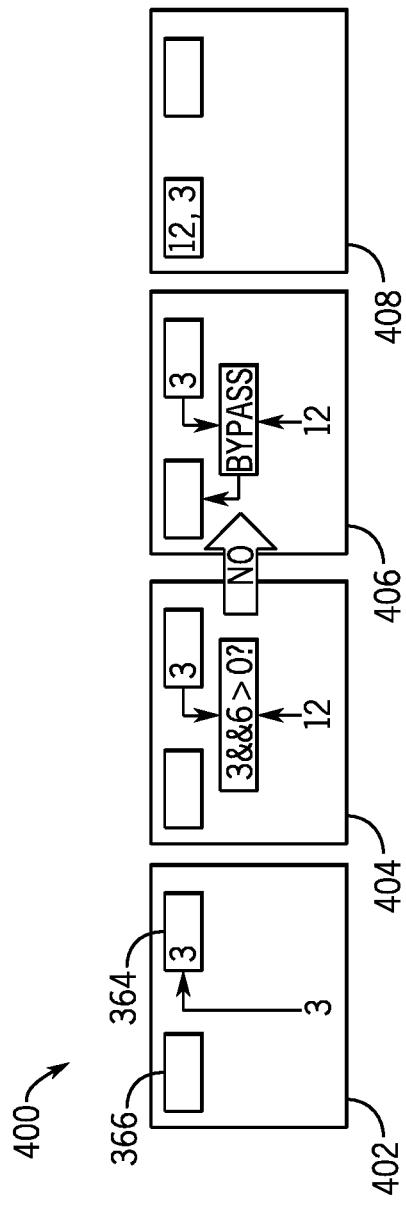
FIG. 7 is a diagram illustrating resolving the electric power system of FIG. 6 using bit pattern sequence compression, in accordance with an aspect of the present disclosure.

FIG. 7 is a diagram illustrating resolving the electric power system of FIG. 6 using bit pattern sequence compression, according to an embodiment of the present disclosure. In action 402, the bit pattern having a bit value of 3 (e.g., 0011) associated with the circuit breaker 204A is loaded into a pattern buffer 364, as the circuit breaker 204A is electrically coupled to the node 206A and the node 206B. In action 404, the processor may receive the bit pattern having a bit pattern of 12 (e.g., 1100) associated with the circuit breaker 204C. The processor may not receive the bit pattern 6 (e.g., 0110) associated with the circuit breaker 204B as the circuit breaker 204B is not electrically coupled to the nodes 206B and 206C.

In the action 404, the processor may perform a bitwise AND operation to determine if there are any overlapping HIGH bit values between the nodes 206 coupled to the circuit breaker 204A and the nodes 206 coupled to the circuit breaker 204C. As may be observed from the table 340, the circuit breaker 204A and the circuit breaker 204C do not overlap at any node (e.g., there is no node at which both the circuit breaker 204A and the circuit breaker 204C have overlapping HIGH bit values). In action 406 the processor may bypass compressing the bit value 3 (e.g., 0011) and the bit pattern 12 (e.g., 1100). In action 408 the processor loads the bit patterns of 3 and 12 into a pattern buffer 366 separately. In some embodiments, the processor may load the bit patterns of 3 and 12 into separate pattern buffers. The processor may output the separated bit patterns of 3 (e.g., 0011) and 12 (e.g., 1100) to the controller or the control development software of the electric power system 200 to indicate to the controller or the control development software that the circuit breakers 204, and thus the transformers 202, are electrically isolated from each other. As may be appreciated, the above embodiments may enable a controller or the control development software of the electric power system 200 to quickly and accurately resolve the topology of the electric power system 200 by analyzing whether a value loaded into the pattern buffers 364 and/or 366 includes a compressed bit pattern or a non-compressed bit pattern.

It should be noted that, while the embodiments above are described as outputting the separated bit values or bit patterns as uncompressed patterns, in other embodiments, the patterns may not be output until the compression process is complete. For instance, in a ring bus topology or a breaker-and-a-half scheme with multiple branches, if only a single circuit breaker 204 is open, two patterns may not intersect with each other. But as the compression process progresses and adds additional bit patterns, the previously uncompressed patterns may be determined to intersect with other patterns.

While specific embodiments and applications of the disclosure have been illustrated and described, it is to be noted that the disclosure is not limited to the precise configurations and devices disclosed herein. For example, the systems and methods described herein may be applied to an industrial electric power delivery system or an electric power delivery system implemented in a boat or oil platform that may or may not include long-distance transmission of high-voltage power. Accordingly, many changes may be made to the details of the above-described embodiments without departing from the underlying principles of this disclosure. The scope of the present disclosure should, therefore, be determined only by the following claims.

Indeed, the embodiments set forth in the present disclosure may be susceptible to various modifications and alternative forms, specific embodiments have been shown by way of example in the drawings and have been described in detail herein. However, it may be noted that the disclosure is not intended to be limited to the particular forms disclosed. The disclosure is to cover all modifications, equivalents, and alternatives falling within the spirit and scope of the disclosure as defined by the following appended claims. In addition, the techniques presented and claimed herein are referenced and applied to material objects and concrete examples of a practical nature that demonstrably improve the present technical field and, as such, are not abstract, intangible or purely theoretical. Further, if any claims appended to the end of this specification contain one or more elements designated as "means for [perform]ing [a function] . . . " or "step for [perform]ing [a function] . . . ", it is intended that such elements are to be interpreted under 35 U.S.C. 112(f). For any claims containing elements designated in any other manner, however, it is intended that such elements are not to be interpreted under 35 U.S.C. 112(f).

What is claimed is:

1. A method, comprising:
receiving a first bit pattern associated with a first multi-node device;
receiving a second bit pattern associated with a second multi-node device;
in response to determining that a logical intersection of the first bit pattern and the second bit pattern is greater than zero, compressing the first bit pattern and the second bit pattern via a logical union operation to generate a third bit pattern; and
outputting the third bit pattern, the third bit pattern indicating that the first multi-node device and the second multi-node device are electrically coupled.

2. The method of claim 1, wherein the first bit pattern comprises a first value generated by performing a bitwise OR operation on a first bit value comprising a first bit asserted at a position of the first bit value corresponding to a first node of the first multi-node device and a second bit value comprising a second bit asserted at a position of the second bit value corresponding to a second node of the first multi-node device.

3. The method of claim 2, wherein the second bit pattern comprises a second value generated by performing the bitwise OR operation on a third bit value comprising a third bit asserted at a position of the third bit value corresponding to a third node of the second multi-node device and a fourth bit value comprising a fourth bit asserted at a position of the fourth bit value corresponding to a fourth node of the second multi-node device.

4. The method of claim 3, wherein the second node comprises the third node and the second bit comprises the third bit.

5. The method of claim 1, comprising:
receiving a fourth bit pattern associated with a third multi-node device; and
determining another logical intersection of the third bit pattern and the fourth bit pattern.

6. The method of claim 5, comprising compressing the third bit pattern and the fourth bit pattern to generate a fifth bit pattern in response to determining that the other logical intersection of the third bit pattern and the fourth bit pattern is greater than zero, the fifth bit pattern indicating that the third multi-node device is electrically coupled to the first multi-node device and the second multi-node device.

7. The method of claim 6, comprising bypassing compression and storing the third bit pattern and the fourth bit pattern in a pattern buffer in response to determining that the other logical intersection of the third bit pattern and the fourth bit pattern is equal to zero, the uncompressed third bit pattern and the uncompressed fourth bit pattern indicating that the third multi-node device is electrically isolated from the first multi-node device and the second multi-node device.

8. A system, comprising:
a first multi-node device coupled to a first node and a second node;
a second multi-node device coupled to the second node and a third node; and
a processor communicatively coupled to the first multi-node device and the second multi-node device, and configured to:
receive a first bit pattern associated with the first multi-node device;
receive a second bit pattern associated with the second multi-node device;
determine a logical intersection of the first bit pattern and the second bit pattern; and
based on the logical intersection, output an indication that the first multi-node device is electrically coupled to the second multi-node device or output an indication that the first multi-node device is electrically isolated from the second multi-node device.

9. The system of claim 8, wherein the processor is configured to output the indication that the first multi-node device is electrically coupled to the second multi-node device based on a determination that the logical intersection comprises a value greater than zero.

10. The system of claim 8, wherein the processor is configured to output the indication that the first multi-node device is electrically isolated from the second multi-node device based on a determination that the logical intersection comprises a value equal to zero.

11. The system of claim 8, wherein the indication that the first multi-node device is electrically coupled to the second multi-node device comprises a value generated by performing a bitwise OR operation on the first bit pattern and the second bit pattern.

12. The system of claim 8, wherein the indication the first multi-node device is electrically isolated from the second multi-node device comprises storing a first bit value corresponding to the first bit pattern and a second bit value corresponding to the second bit pattern into a pattern buffer.

13. The system of claim 8, wherein the first multi-node device, the second multi-node device, or both comprise a circuit breaker.

14. A tangible, non-transitory, computer-readable medium comprising machine-readable instructions configured to cause a processor to:
receive a first bit pattern associated with a first multi-node device;
receive a second bit pattern associated with a second multi-node device;
in response to determining that a logical intersection of the first bit pattern and the second bit pattern is greater than zero, compress the first bit pattern to generate a third bit pattern; and
output the third bit pattern, the third bit pattern indicating that the first multi-node device and the second multi-node device are electrically coupled.

15. The tangible, non-transitory medium of claim 14, wherein the first bit pattern comprises a first value generated by performing a bitwise OR operation on a first bit value comprising a first bit asserted at a position of the first bit value corresponding to a first node of the first multi-node device and a second bit value comprising a second bit asserted at a position of the second bit value corresponding to a second node of the first multi-node device.

16. The tangible, non-transitory medium of claim 15, wherein the second bit pattern comprises a second value generated by performing the bitwise OR operation on a third bit value comprising a third bit asserted at position of the third bit value corresponding to a third node of the second multi-node device and a fourth bit value comprising a fourth bit asserted at a position of the fourth bit value corresponding to fourth node of the second multi-node device.

17. The tangible, non-transitory medium of claim 14, wherein the first multi-node device comprises a first circuit breaker and the second multi-node device comprises a second circuit breaker.

18. The tangible, non-transitory computer-readable medium of claim 14, wherein the machine-readable instructions are configured to cause the processor to:

receive a fourth bit pattern associated with a third multi-node device; and
determine another logical intersection of the third bit pattern and the fourth bit pattern.

19. The tangible, non-transitory computer-readable medium of claim 18, comprising compressing, via a bit compressor, the third bit pattern and the fourth bit pattern to generate a fifth bit pattern in response to determining that the other logical intersection of the third bit pattern and the fourth bit pattern is greater than zero, the fifth bit pattern indicating that the third multi-node device is electrically coupled to the first multi-node device and the second multi-node device.

20. The tangible, non-transitory computer-readable medium of claim 18, comprising bypassing compression and storing the third bit pattern and the fourth bit pattern in respective pattern buffers in response to determining that the other logical intersection of the third bit pattern and the fourth bit pattern is equal to zero, the uncompressed third bit pattern and the uncompressed fourth bit pattern indicating that the third multi-node device is electrically isolated from the first multi-node device and the second multi-node device.

* * * * *